(12) United States Patent
Yamaguchi

(10) Patent No.: US 7,352,020 B2
(45) Date of Patent: Apr. 1, 2008

(54) SOLID-STATE IMAGE PICKUP DEVICE, AND MANUFACTURING METHOD THEREOF

(75) Inventor: Takumi Yamaguchi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 17 days.

(21) Appl. No.: 10/526,564

(22) PCT Filed: Sep. 12, 2002

(86) PCT No.: PCT/JP02/09324

§ 371 (c)(1),
(2), (4) Date: Mar. 4, 2005

(87) PCT Pub. No.: WO2004/025732

PCT Pub. Date: Mar. 25, 2004

(65) Prior Publication Data

US 2006/0007336 A1    Jan. 12, 2006

(51) Int. Cl.
*H01L 31/113* (2006.01)

(52) U.S. Cl. .............................. 257/292; 257/E27.132; 257/E27.133; 257/232; 257/233; 257/234

(58) Field of Classification Search ........ 257/291–294, 257/222–223, 229, 232, 233, 235, 236, 237, 257/238, E27.133, E27.132, 234; 348/308
See application file for complete search history.

(56) References Cited

U.S. PATENT DOCUMENTS

| 4,870,441 | A | * | 9/1989 | Yamasaki | ..................... 396/96 |
| 5,698,844 | A | * | 12/1997 | Shinohara et al. | ...... 250/214 R |
| 5,698,902 | A | | 12/1997 | Uehara et al. | |
| 5,946,563 | A | | 8/1999 | Uehara et al. | |
| 6,184,516 | B1 | | 2/2001 | Sawada et al. | |
| 6,621,886 | B2 | | 9/2003 | Kawahata | |

(Continued)

FOREIGN PATENT DOCUMENTS

EP    1 075 028 A2    2/2001

(Continued)

OTHER PUBLICATIONS

Supplementary Search Report dated Jan. 26, 2007.

*Primary Examiner*—Minhloan Tran
*Assistant Examiner*—Benjamin Tzu-Hung Liu
(74) *Attorney, Agent, or Firm*—McDermott Will & Emery LLP

(57) ABSTRACT

The present invention aims to provide a solid-state imaging apparatus that realizes less leakage current, high image quality and low noise during the driving operation, and manufacturing method for the same. A MOS type imaging apparatus 1 includes an imaging region 10 and a driving region 20 both formed on a p-type silicon substrate (hereinafter called an "Si substrate") 31. The imaging region 10 includes six pixels 11 to 16 disposed in a shape of a matrix having 2 rows and 3 columns. The driving region 20 includes a timing generation circuit 21, a vertical shift resistor 22, a horizontal shift resistor 23, a pixel selection circuit 24, and so on. All transistors included in the pixels 11 to 16 in the imaging region and the circuits 21 to 24 in the driving circuit region 20 are of n-channel MOS type.

14 Claims, 11 Drawing Sheets

U.S. PATENT DOCUMENTS 6,642,560 B2 * 11/2003 Momose et al. ............ 257/288
2001/0052574 A1 * 12/2001 Kurosawa et al. ....... 250/423 P
2002/0000508 A1 1/2002 Hagihara

FOREIGN PATENT DOCUMENTS

| EP | 1075028 A2 * | 2/2001 |
| EP | 1 182 881 A2 | 2/2002 |
| GB | 2 334 817 | 1/1999 |
| JP | 5-275690 | 10/1993 |
| JP | 8-148424 | 6/1996 |
| JP | 8-148677 | 6/1996 |
| JP | 8-213595 | 8/1996 |
| JP | 08-236767 | 9/1996 |
| JP | 10-335625 | 12/1998 |
| JP | 2001-111022 | 4/2001 |
| JP | 2002-16839 | 1/2002 |
| JP | 2002-016893 | 1/2002 |

* cited by examiner

TO PIXEL SELECTION CIRCUIT

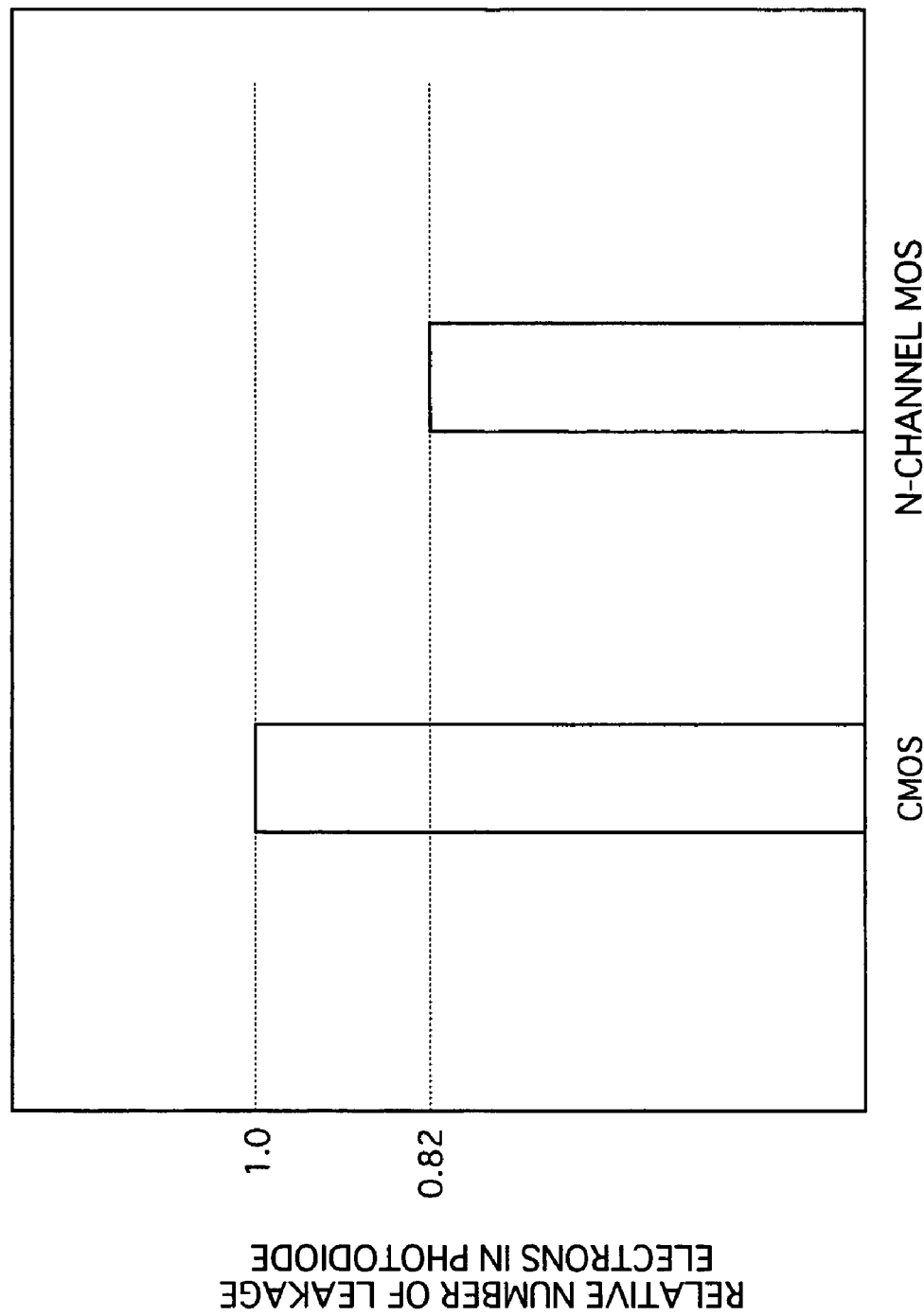

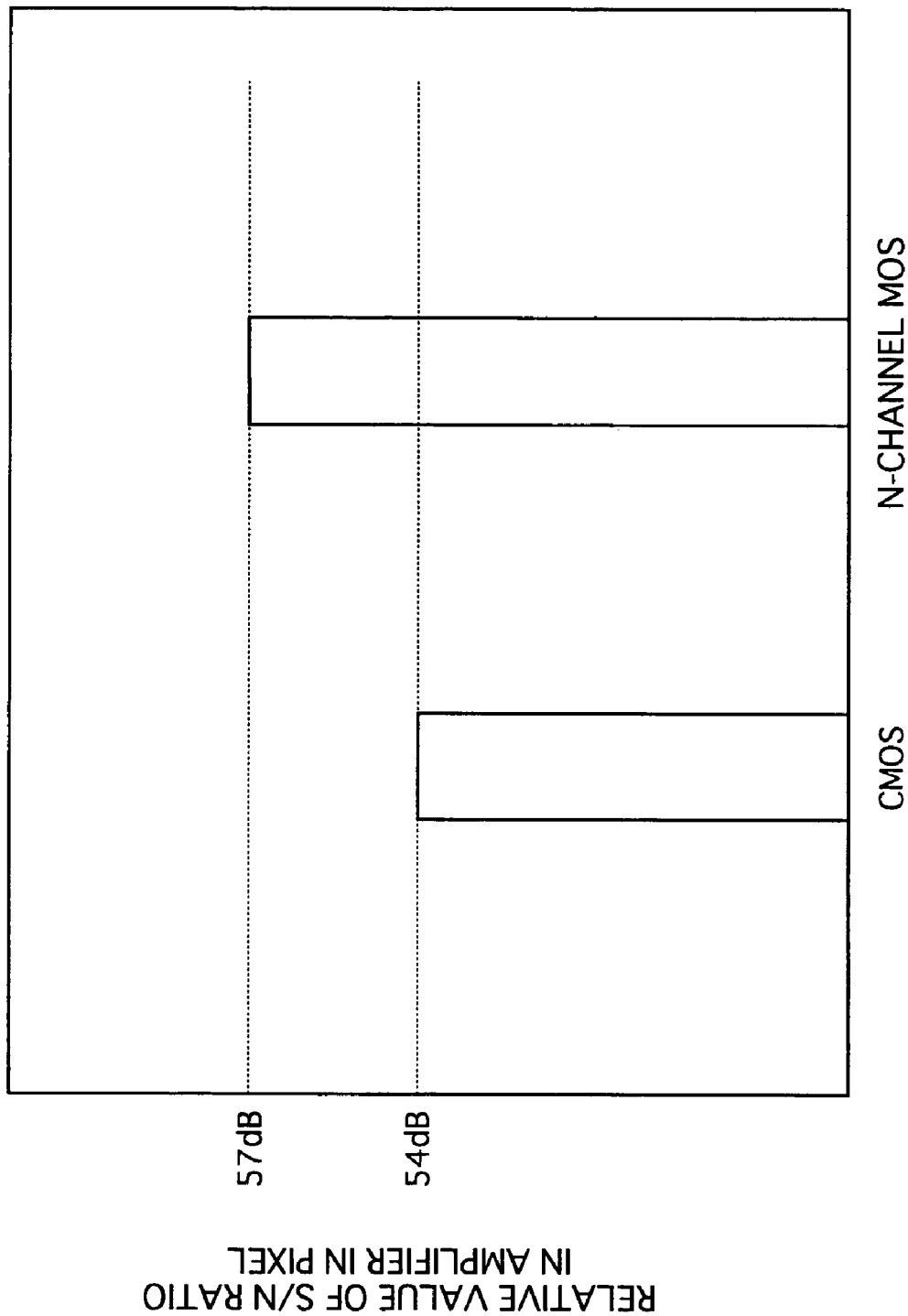

SOLID-STATE IMAGE PICKUP DEVICE, AND MANUFACTURING METHOD THEREOF

TECHNICAL FIELD

The present invention relates to a solid-state imaging apparatus used for a digital camera and so on, and a manufacturing method for the same.

BACKGROUND ART

Among solid-state imaging apparatuses, MOS (Metal Oxide Semiconductor) type imaging apparatuses include pixels two-dimensionally disposed on a substrate, each of which subjects input light to photoelectric conversion performed by a photodiode disposed in the pixel to generate signal charge, and amplifies the generated signal charge by an amplification circuit placed in the pixel. The amplified signal charge is to be read out from the pixel. Such MOS type imaging apparatuses can be driven with a low voltage and low power consumption. Also, an imaging region and a drive circuit region that drives the imaging region can be realized as one chip. In other words, they can be formed on one substrate. Therefore, the MOS type imaging apparatuses are attracting considerable attention as image input devices of portable appliances.

Conventional MOS type imaging apparatuses are structured in such a manner that the imaging region and the drive circuit region are formed on one silicon substrate (hereinafter called the "Si substrate") based on CMOS (Complementary Metal Oxide Semiconductor) processing technology. In the CMOS processing technology, apparatuses and processes have been designed and developed with the main aim of making the driving speed faster.

The imaging region includes a plurality of pixels that are disposed on the Si substrate two-dimensionally (e.g. in a shape of a matrix). Each pixel includes a photodiode unit for converting received light to signal charge, a MOS type transistor for performing a switching function, and a MOS type transistor for amplifying signals.

The signal charge generated in the photodiode unit by the photoelectric conversion is amplified in each pixel by a switching operation based on instruction signals received from a vertical shift register and a horizontal shift register, which are included in a drive circuit region described later. Then the amplified signal is to be read out from each pixel.

Every MOS type transistor included in the imaging region is of an n-channel MOS type.

The drive circuit region includes four main circuits, namely a timing generator circuit, a vertical shift register, a horizontal shift register, and a pixel selection circuit. Every MOS type transistor included in the drive circuit region has a CMOS structure, which is a combination of an n-channel MOS type and a p-channel MOS type.

The n-channel MOS type transistors in the imaging region and then-channel MOS type transistors in the drive circuit region usually have the same structure.

The following describes the circuit structure of the horizontal shift register, with reference to FIG. 10. Generally, the horizontal shift register has several stages. The number of the stages is in accordance with the number of pixel lines. FIG. 10 shows only the $1^{st}$ stage of the horizontal shift register.

As FIG. 10 shows, the $1^{st}$ stage 50 of the horizontal shift register includes four switches 51, 54, 55 and 58, and four inverters 52, 53, 56 and 57. Each of the switches 51, 54, 55 and 58, and each of the inverters 52, 53, 56 and 57 includes a pair of an n-channel MOS type transistor and a p-channel MOS type transistor.

The inverters 52 and 53 are connected in series with each other. The pair of inverters 52 and 53 is connected in parallel with the switch 54. The switch 51 is connected in series with the group of the inverters 52 and 53 and the switch 54 that are in the above-described relation.

The switches 55 and 58 and the inverters 56 and 57 have the same relation as described above.

The $1^{st}$ stage 50 of the horizontal shift register, having such a structure, starts the driving operation when being applied a start pulse VST by the switch 51, and outputs an operation pulse of the $1^{st}$ stage to the pixel selection circuit when being applied a clock pulse CK1 and its inversion pulse CK2 twice for each. Then, the horizontal shift register outputs operation pulses of the $2^{nd}$ and $3^{rd}$ stages sequentially.

The following describes the device structure of a transistor (CMOS type) in the $1^{st}$ stage of the horizontal shift register, with reference to FIG. 11. FIG. 11 is a cross-sectional view showing the device structure of the above-described switches 51, 54, 55 and 58, or inverters 52, 53, 56 and 57.

As FIG. 11 shows, an n-well 62 and a p-well 63 are formed underneath the surface of the Si substrate 61 with an interval.

A gate insulator 64 is formed on the surfaces of the Si substrate 61 so as to cover the n-well 62 and the p-well 63. Gate electrodes 67 and 70 are formed on the surface of the gate insulator 64 so as to be on a substantially center portions of the wells respectively.

Source regions 65 and 68, and drain regions 66 and 69 are formed underneath the boundary portion between the gate insulator 64 and the wells 62 and 63.

In such a manner, a p-channel MOS type transistor is formed on the Si substrate 61 from three electrodes, namely the gate electrode 67, the source region 65 and the drain region 66. Also, an n-channel MOS type transistor is formed on the Si substrate 61 from three electrodes, namely the gate electrode 70, the source region 68, and the drain region 69.

The MOS type imaging apparatus having the CMOS structure is formed through following steps 1 to 15 aimed at the Si substrate 61.

1. Form a resist for forming the n-well 62.
2. Form the n-well 62.
3. Remove the resist for forming the n-well 62.
4. Form a resist for forming the p-well 63.
5. Form the p-well 63.
6. Remove the resist for forming the p-well 63.
7. Form the gate insulator 64.
8. Form the gate electrodes 67 and 70.
9. Form a resist for forming the source region 65/the drain region 66 of n-channel MOS type.
10. Form the source region 65/the drain region 66 of n-channel MOS type.
11. Remove the resist for forming the source region 65/the drain region 66 of n-channel MOS type.
12. Form a resist for forming the source region 68/the drain region 69, which are of p-channel MOS type.
13. Form the source region 68/the drain region 69 of p-channel MOS type.
14. Remove the resist for forming the source region 68/the drain region 69 of p-channel MOS type.
15. Form the photodiode unit.

However, the conventional MOS type imaging apparatuses manufactured based on such a CMOS processing technology might suffer, in the imaging region, leakage current in the photodiode unit and characteristic deterioration in the amplification circuit during the driving operation, which become causes of a noise. When a noise is caused in the imaging region, it is amplified and output with the signal charge, resulting in deterioration of the image quality.

DISCLOSURE OF THE INVENTION

In view of the above problem, the present invention aims to provide a solid-state imaging apparatus that realizes less leakage current, high image quality and low noise during the driving operation, and manufacturing method for the same.

The object can be achieved by a solid-state imaging apparatus that includes an imaging region and a drive circuit region both formed on one semiconductor substrate, the imaging region including an active-type unit pixel in which a photodiode unit generates signal charge by photoelectric conversion and an amplification unit amplifies the signal charge, the drive circuit region being for driving the photodiode unit and the amplification unit, the imaging region and the drive circuit region including one or more transistors respectively, wherein the transistors in the imaging region and the drive circuit region have a same channel polarity.

In the stated solid-state imaging apparatus, all the transistors included in the imaging region and the drive circuit region have the same channel polarity. Therefore, as to the stated apparatus, the number of processes required for forming all the transistors in both regions is only approximately a half the number of processes required for manufacturing the conventional solid-state imaging apparatus with use of the CMOS processing technology. This means that the imaging region suffers less damage during the process for forming the transistors.

In other words, the stated solid-state imaging apparatus has an advantage that it suffers less noise in the amplification unit and less leakage current in the photodiode unit, and therefore suffers less deterioration of the image quality caused by the noise and the leakage current.

Note that the "active-type unit pixel" means a pixel that is formed with a photodiode unit for subjecting the input light, which is input to an area corresponding to a unit pixel, to the photoelectric conversion, and an amplification unit for amplifying the converted signal.

For realizing a high-speed driving of the apparatus, it is preferable that the transistors are of an n-channel MOS type.

For reducing the power consumption, it is preferable that the drive circuit region includes a dynamic circuit that includes a capacitor for accumulating electric charge and a transistor for performing a switching function.

Usually, a plurality of active-type unit pixels are formed in the imaging region in the solid-state imaging apparatus. Methods, such as scanning method, a random access method, an edge detection method, are used as for reading signal charge from the plurality of the active-type unit pixels. In particular, for performing the scanning method to realize high-speed driving, it is preferable that the imaging region includes a plurality of the active-type unit pixels, and the drive circuit region includes a pixel selection circuit for selecting one active-type unit pixel from the plurality of the active-type unit pixels and a shift register circuit for outputting a selection instruction signal to the pixel selection circuit.

For reducing the power consumption, it is preferable that the imaging region includes a transistor for performing a switching function based on a signal received from the drive circuit region, and the signal charge is output to the amplification unit while the transistor is ON.

In a case where the gate length of the transistors is as minute as 0.6 μm or even less, the conventional CMOS processing technology might cause an increase of the leakage current in the photodiode unit and an increase of the noise in the amplification unit during the driving operation. This is because the short channel effect is accelerated as the number of heating processes increases, and the amplification unit or the photodiode unit suffers damage when the resists are removed.

On the other hand, when the transistors have the same channel polarity as in the solid-state imaging apparatus of the present invention, the increase of leakage current during the driving operation is to be suppressed, because the number of heating processes and the number of processes for removing the resists are reduced in the present invention. Therefore, it is advantageous when the transistor is of a MOS type, of which a gate length is equal to or less than 0.6 μm (a design rule for the value of the gate length defined to be equal to or less than 0.6 μm).

In the conventional solid-state imaging apparatus, the gate electrode of the transistor is formed on the insulator film covering the semiconductor substrate. When the gate insulator is a thin film having a thickness which is not more than 20 (nm), the leakage current very frequently occurs between the gate insulator film and the semiconductor substrate. However, if the transistors have the same channel polarity as in the solid-state imaging apparatus of the present invention, less leakage current occurs even when the solid-state imaging apparatus includes such a thin gate insulator.

Also, the leakage current can be reduced when the transistor is of a MOS type, of which a film thickness of a gate insulator is in a range from 1 nm to 20 nm.

Such solid-state imaging apparatus can be built into a camera and so on, as an input image sensor, which can gain high-quality images.

The manufacturing method for the solid-state imaging apparatus of the present invention comprises steps of: forming, on a semiconductor substrate, an imaging region including a photodiode unit for converting input light into signal charge and an amplification unit for amplifying the signal charge; and forming, on the semiconductor substrate, a drive circuit region for driving the imaging region, wherein MOS type transistors having a same channel polarity are formed in both steps for forming the imaging region and the drive circuit region respectively.

In this manufacturing method, all the transistors included in the imaging region and the drive circuit region can be formed by only one process, which is the process for forming n-channel MOS type transistors or the process for forming p-channel MOS type transistors. This means that the photodiode unit, the amplification unit and so on, which are included in the imaging region, suffer less damage during the manufacturing process. Therefore, the solid-state imaging apparatus manufactured by the stated manufacturing method suffers less damage in the imaging region during the manufacturing process, and can reduce the noise due to the leakage current in the photodiode unit and the characteristic deterioration in the amplification unit caused by the damage.

In other words, the stated manufacturing method can manufacture a solid-state imaging apparatus with high quality images and less noise during the driving operation that is capable of reducing the damage on the photodiode unit and the amplification unit, which is a cause of the leakage current in the photodiode unit and the characteristic deterioration in the amplification unit.

For realizing high-speed driving of the solid-state imaging apparatus, it is preferable in the stated manufacturing process for the solid-state imaging apparatus that the MOS type transistors formed in the both steps are of n-channel MOS type.

The stated manufacturing method can reduce the noise by suppressing the leakage current which occurs during the driving operation even when a gate length of each MOS type transistor is equal to or less than 0.6 µm (a design rule for the value of the gate length defined to be equal to or less than 0.6 µm).

Also, the stated manufacturing method is advantageous especially when a film thickness of a gate insulator in each MOS type transistor is in a range from 1 nm to 20 nm, because it can reduce the leakage current which occurs during the driving operation, by forming the MOS type transistors so as to have the same channel polarity.

Further, the stated manufacturing method is advantageous especially when an insulator that has a film thickness in a range from 1 nm to 20 nm and functions as a capacitor is formed between a gate electrode of each MOS type transistor and the semiconductor substrate, because it can reduce the leakage current which occurs during the driving operation.

BRIEF DESCRIPTION OF THE DRAWINGS

FIG. 8 is a comparative characteristic diagram showing a relation between a conductive type of a transistor and the number of leakage electrons in a photodiode;

FIG. 9 is a comparative characteristic diagram showing a relation between a conductive type of a transistor and an S/N ratio in an amplifier included in a pixel;

BEST MODE FOR CARRYING OUT THE INVENTION

Figure 1:
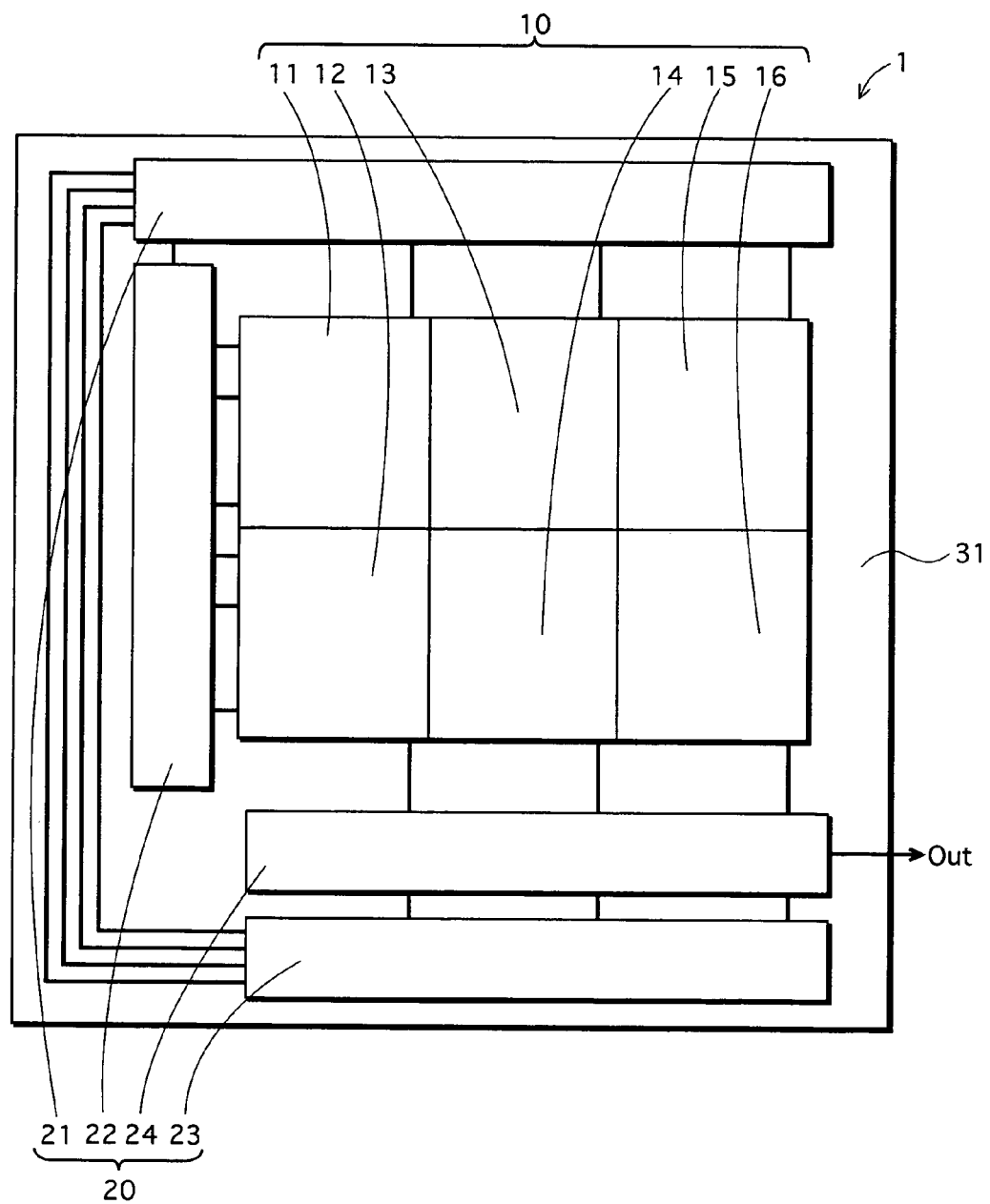
FIG. 1 is a plan view of a MOS type imaging apparatus pertaining to the embodiment of the present invention.
Figure 2:
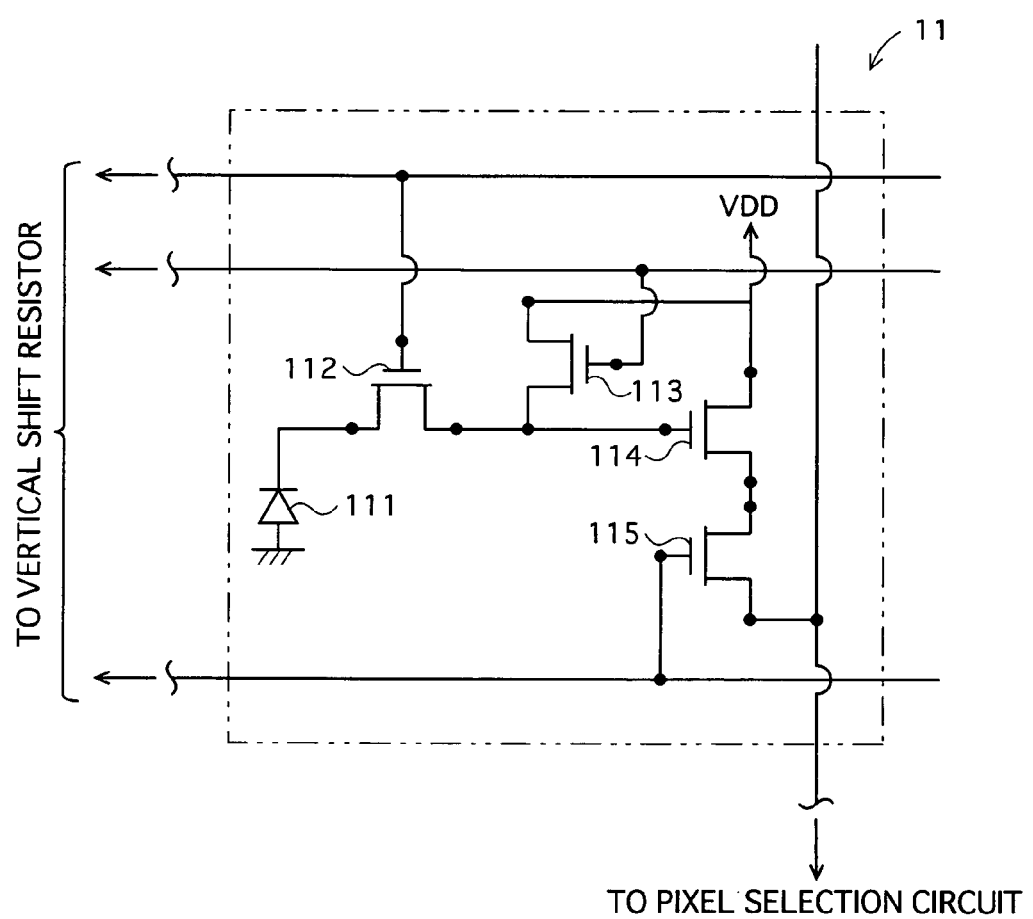
FIG. 2 is a circuit diagram of a pixel 11 in an imaging region 10.
Figure 3:
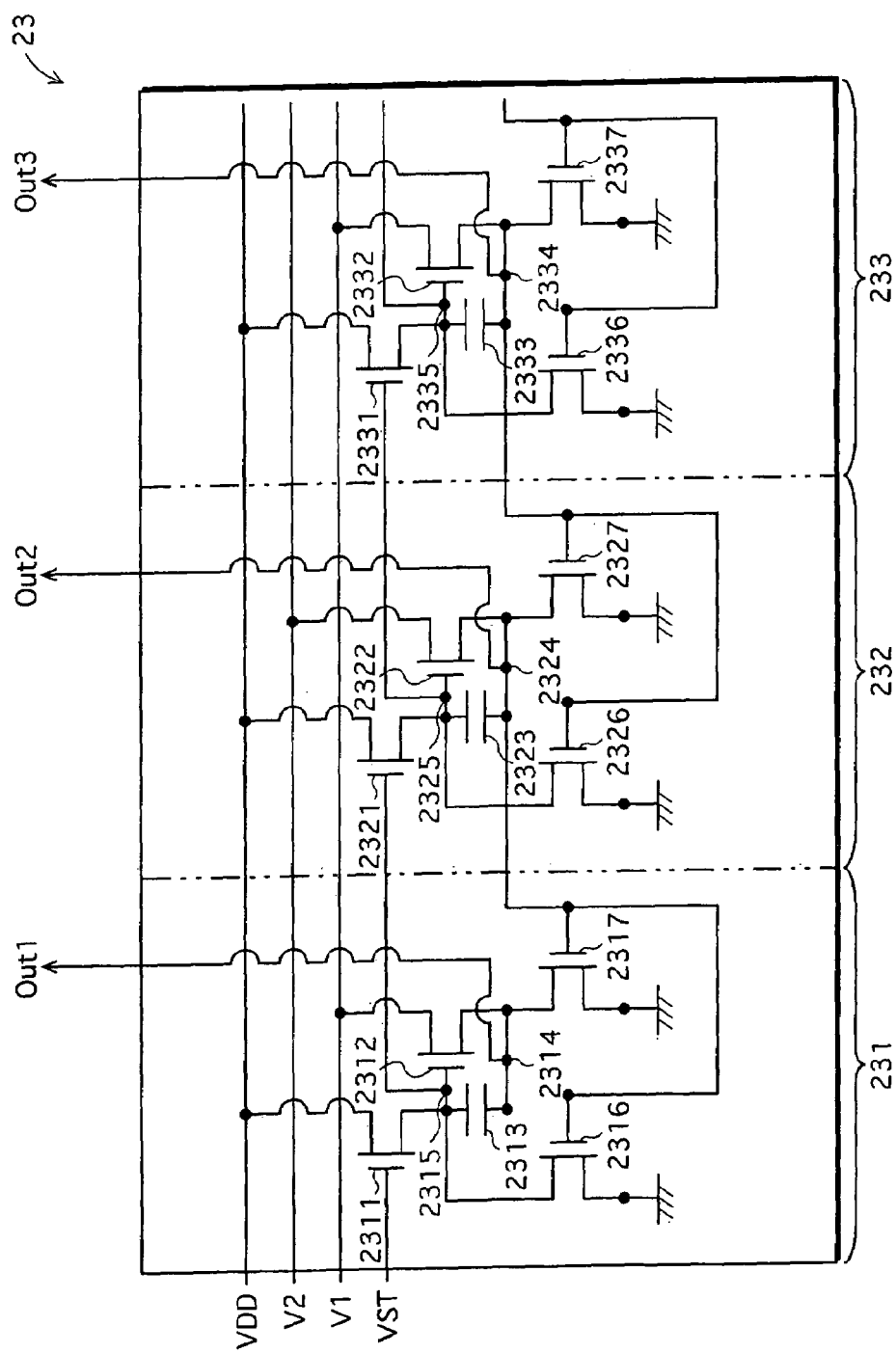
FIG. 3 is a circuit diagram of a horizontal shift register 23.

The following describes a MOS type imaging apparatus which is an embodiment of the present invention, with reference to FIG. 1 to FIG. 3. FIG. 1 is a plan view (a block diagram) showing an overall structure of a MOS type imaging apparatus 1 as an image input device used for a digital camera pertaining to this embodiment. FIG. 2 is a circuit diagram of a circuit 11 in a region corresponding to an active-type unit pixel of the MOS type imaging apparatus 1. (A circuit in a region corresponding to an active-type unit pixel is hereinafter simply called a "pixel".) FIG. 3 is a circuit diagram of a horizontal shift register 23.

As FIG. 1 shows, the MOS type imaging apparatus 1 includes an imaging region 10 and a drive circuit region 20 formed on a p-type silicon substrate (hereinafter called an "Si substrate") 31. Circuits included in the imaging region 10 and in the drive circuit region 20 are electrically connected with each other with use of a wiring pattern formed on the Si substrate 31.

In FIG. 1, circuits included in the regions 10 and 20 are shown as blocks. In practice, however, functional device units included in the regions 10 and 20 are densely formed on the Si substrate 31.

The imaging region 10 includes six pixels 11 to 16 disposed in a shape of a matrix having 2 rows and 3 columns. The drive circuit region 20 includes a timing generator circuit 21, a vertical shift register 22, a horizontal shift register 23, a pixel selection circuit 24, and so on.

Among these, the vertical shift register 22 and the horizontal shift register 23 are dynamic circuits. They sequentially output drive pulses (switching pulses) to the pixels 11 to 16 or to the pixel selection circuit 24 according to a signal received from the timing generator circuit 21.

Also, the pixel selection circuit 24 includes three switching devices (not shown in figures), namely one for pixels 11 and 12, one for pixels 13 and 14, and one for 15 and 16. They are sequentially turned on by receiving pulses from the horizontal shift register 23.

The six pixels 11 to 16 in the imaging region 10 are active-type unit pixels, each having an amplification unit. The signal charge generated by the photoelectric conversion is read from a pixel at a position where a row selected by the vertical shift register 22 intersects with a column whose pixel selection circuit 24 is turned on.

The timing generator circuit 21 is a circuit for applying a power supply voltage, a timing pulse, and so on to the above-described vertical shift register 22 and the horizontal shift register 23.

Circuit Structure of Each Pixel in the Imaging Region 10

The six pixels 11 to 16 are active-type unit pixels, and have the same circuit structure. The following describes the circuit structure of a pixel, with reference to FIG. 2, taking the pixel 11 as an example.

As FIG. 2 shows, the pixel 11 includes a photodiode unit 111 and four transistors (a transfer transistor 112, a reset transistor 113, an amplification transistor 114, and a selection transistor 115) and so on, formed on the Si substrate 31. Among these, all the four transistors are of n-channel MOS type.

As FIG. 2 shows, the photodiode unit 111 is a device unit having a photoelectric conversion function, which is for generating signal charge in proportion to the intensity of input light. One end of the photodiode unit 111 is earthed and the other end is connected with the source region of the transfer transistor 112.

The transfer transistor 112 is a device unit for transferring signal charge generated by the photodiode unit 111 to a drain region of the transfer transistor 112 itself. The drain region functions as a detection unit. A gate electrode of the amplification transistor 114 and a source region of the reset transistor 113 are connected with the drain region.

The reset transistor 113 is a device unit for resetting the signal charge accumulated in the drain region of the transfer transistor 112 in a predetermined cycle. The drain region of the reset transistor 113 is connected with the power supply voltage VDD.

The amplification transistor 114 is a device unit for outputting the signal charge accumulated in the drain region of the transfer transistor 112 when the selection transistor 115 is turned on according to signals received from the vertical shift register 22 and so on. The drain region of the amplification transistor 114 is connected with the power supply voltage VDD, and the source region of the amplification transistor 114 is connected with the drain region of the selection transistor 115.

The source region of the selection transistor 115 is connected with the pixel selection circuit 24.

The gate electrode of the transfer transistor 112, the gate electrode of the reset transistor 113, and the gate electrode of the selection transistor 115 are respectively connected with the three signal lines coming from the vertical shift register 113.

Among four transistors 112 to 115, the amplification transistor 114 performs a signal amplification function for the signal charge in the pixel 11, and the other transistors 112, 113 and 115 perform a switching function.

In the pixel 11 having above-described circuit structure, the signal charge generated by the photodiode unit 111 with use of the photoelectric conversion is accumulated in the photodiode unit 111. The accumulated signal charge in the photodiode unit 111 is to be transferred to the drain region (detection unit) of the transfer transistor 112, and to be output to the gate electrode of the amplification transistor 114, when the transfer transistor 112 is turned on based on instruction signals received from the vertical shift register 22.

Receiving the signal charge, the amplification transistor 114 amplifies the received signal charge.

The selection transistor 115 performs ON/OFF operations based on the instruction signals received from the vertical shift register 22.

The reset transistor 113 eliminates the signal charge accumulated in the detection unit in a predetermined cycle to reset the accumulation status of the signal charge in the detection unit.

In the imaging region 10 of the MOS type imaging apparatus 1, each of the pixels 11 to 16 accumulates the signal charge generated by the photoelectric conversion. In one of these pixels, which is selected by the selection transistor in each pixel and the pixel selection circuit 23 based on the instruction signals received from the vertical shift register 22 and the horizontal resistor 23, the signal charge is amplified and output.

Circuit Structure of the Horizontal Shift Resistor 23

Among circuits 21 to 24 included in the drive circuit region 20, the following describes the circuit structure of the horizontal shift register 23, with reference to FIG. 3.

Figure 10:
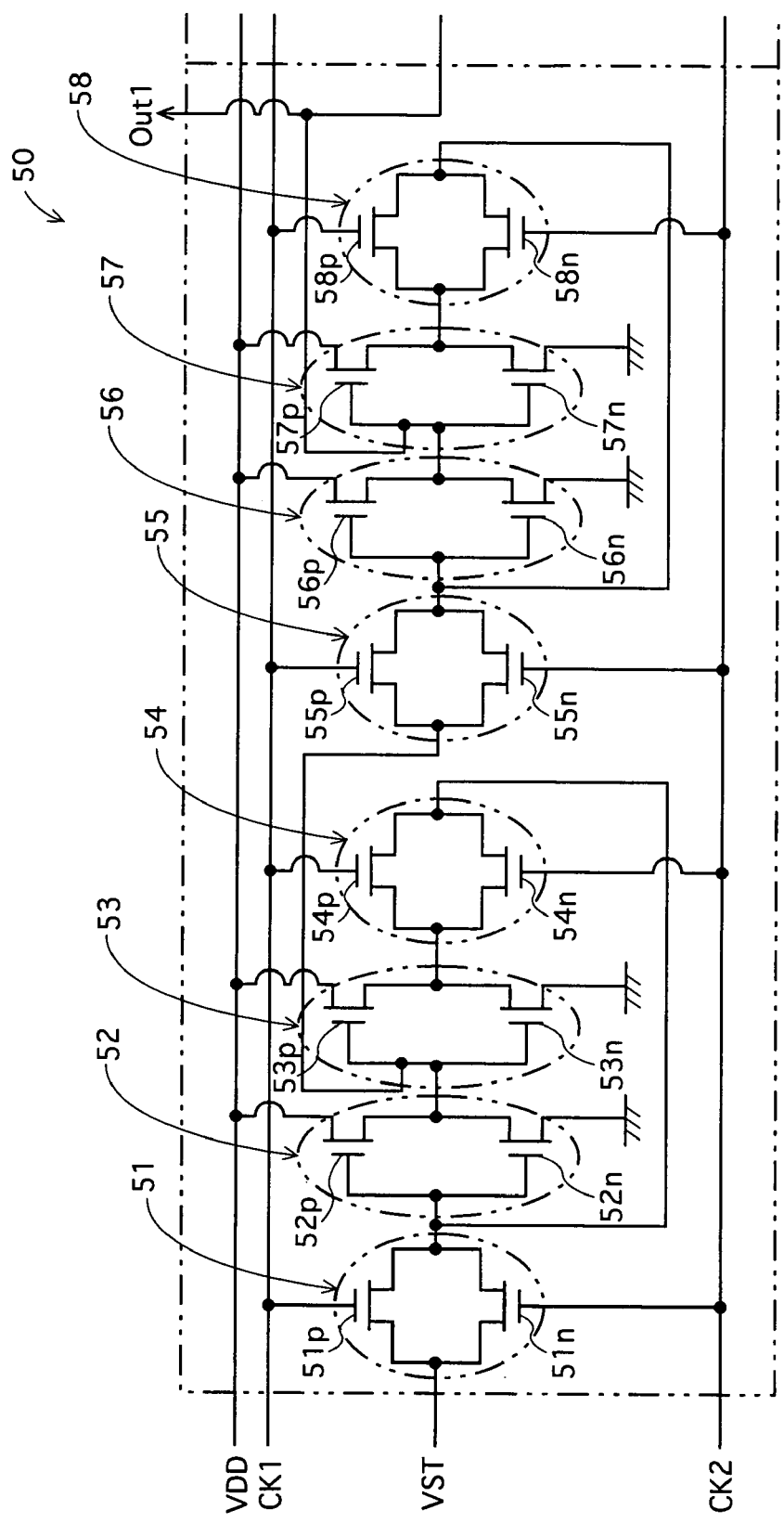
FIG. 10 shows a circuit diagram of a conventional horizontal shift register.

The horizontal shift register 23 shown in FIG. 3 is different from the conventional horizontal shift register (1$^{st}$ stage) 50 shown in FIG. 10 in that all the transistors are of n-channel MOS type.

As FIG. 3 shows, the horizontal shift register 23 includes three stages, namely the 1$^{st}$ stage 231, the 2$^{nd}$ stage 232, and the 3$^{rd}$ stage 233, so that the number of the stages corresponds to the number of columns of pixels 11 to 16 in the imaging region. The 1$^{st}$ stage 231, the 2$^{nd}$ stage 232, and the 3$^{rd}$ stage 233 have the same circuit structure. Therefore, the following describes only the circuit structure of the 1$^{st}$ stage 231 as an example.

As FIG. 3 shows, the 1$^{st}$ stage 231 of the horizontal shift register 23 includes four transistors 2311, 2312, 2316 and 2317, and a bootstrap capacitor 2313 for bootstrapping.

Among these, four transistors 2311, 2312, 2316 and 2317 are all n-channel MOS type transistors just as the four transistors 112 to 115 included in the above-described imaging region 10.

The charging transistor 2311 is an enhancement-mode n-channel MOS type device unit which charges the bootstrap capacitor 2313. The gate electrode of the charging transistor 2311 is connected with a signal line for the start pulse VST. The drain region of the charging transistor 2311 is connected with the power supply voltage VDD, and the source region of the charging transistor is connected with one end (the plus terminal) of the bootstrap capacitor 2313. Here, the start pulse VST and the power apply voltage VDD are applied by the timing generator circuit 21. A drive pulse V1, which is described later, is applied by the timing generator circuit 21 as well.

The source region of the charging transistor 2311 is connected with a node 2315 and a drain region of a discharge transistor 2316. The node 2315 is connected with a gate electrode of an output transistor 2312.

As to the output transistor 2312, the gate is connected with the source region of the charge transistor 2311 via the node 2315 as described above, the drain region is connected with a signal line for the drive pulse VI, and the source region is connected with the other end (the minus terminal) of the bootstrap capacitor 2313. The source region of the output transistor 2312 is connected with the drain region of the discharge transistor 2317 as well.

An output node 2314 is disposed between the minus terminal of the bootstrap capacitor 2313 and the source region of the output transistor 2312, and connected with the imaging region 10.

Source regions of two discharge transistor 2316 and 2317 are earthed respectively, and the gate electrodes of them are connected with an output node 2324 of the 2$^{nd}$ stage 232.

The drain region of the output transistor 2322 included in the 2$^{nd}$ stage 232 is connected with a signal line for a drive pulse V2.

The circuit structure of the 2$^{nd}$ stage 232 is the same as the 1$^{st}$ stage 231 except the above-described components.

Also, the circuit structure of the 3$^{rd}$ stage 233 is the same as the other stages except that the drain region of the output transistor 2332 is connected with the signal line for the drive pulse V1.

Figure 11:
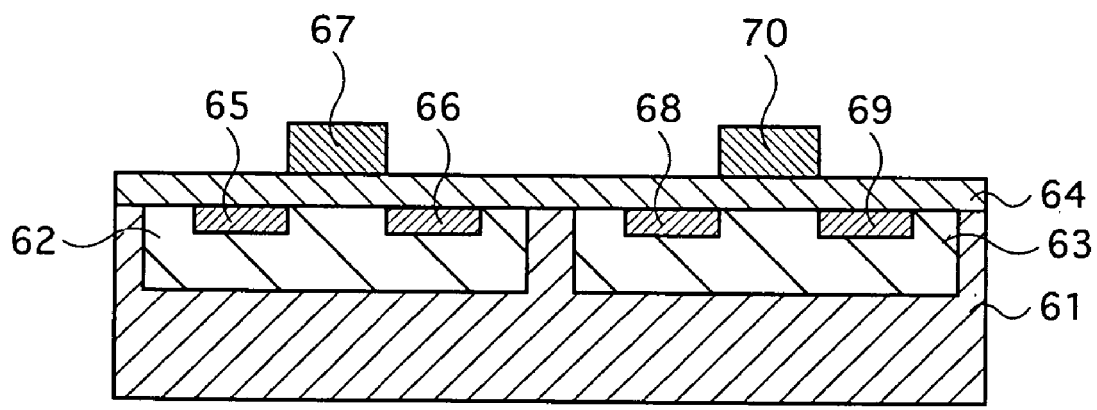
FIG. 11 is a cross-sectional view showing a device structure of a transistor included in a conventional horizontal sift resistor.

As described above, the horizontal shift register 23, whose transistor is formed with only n-channel MOS type, includes four transistors and one capacitor for each stage. The above-described conventional horizontal shift register having the conventional CMOS type structure, which is shown in FIG. 11, includes 16 transistors for each stage. Meanwhile, the horizontal shift register 23 includes fewer functional device units (transistors and a capacitor), namely only five in total.

Therefore, the horizontal shift register 23 can gain the same or even higher drive speed than the high drive speed of the horizontal shift register of CMOS type shown in FIG. 10. This is realized by designing a circuit in such a manner that the number of necessary functional devices is to be reduced.

Drive Operation of the Horizontal Shift Resistor 23

Figure 4:
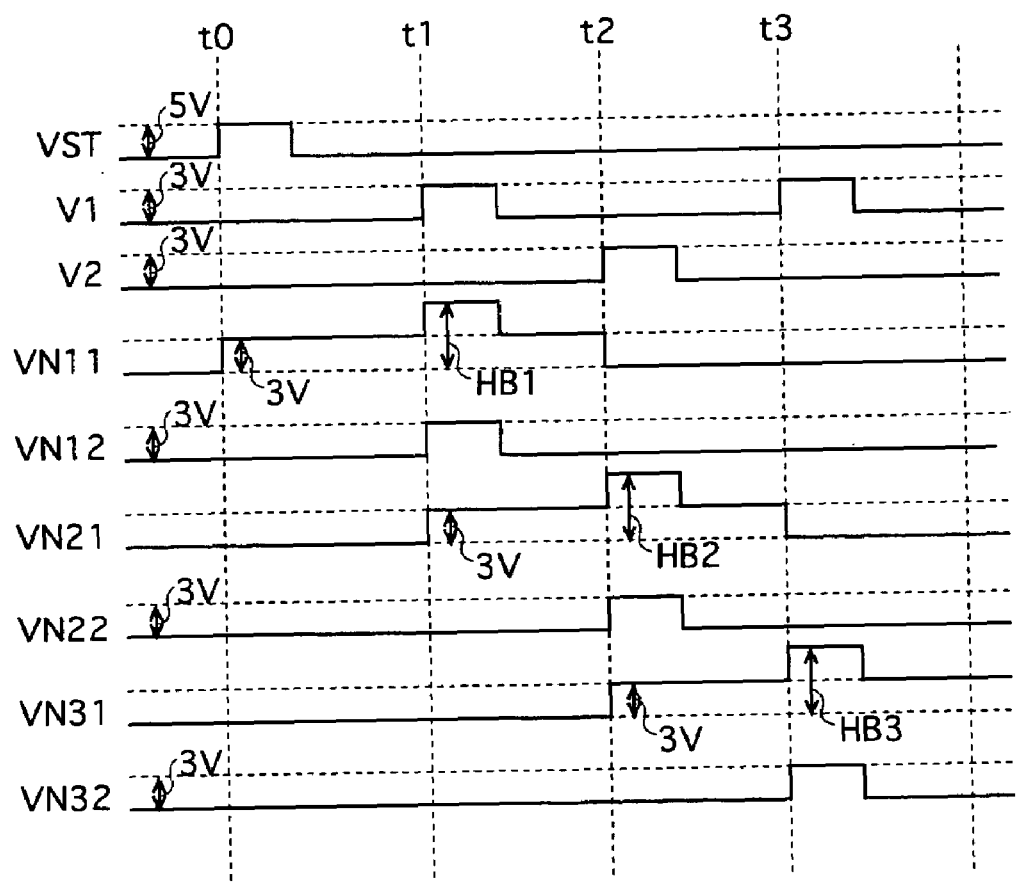
FIG. 4 is an operation timing chart showing an operation of a horizontal shift register 23.

The following describes the drive operation of the horizontal shift register 23 having the above-described circuit structure, with reference to FIG. 4. FIG. 4 is a drive timing chart of the horizontal shift register 23.

As FIG.4 shows, in the horizontal shift resistor 23, the charging transistor 2311 is turned on when a start pulse VST (voltage 5(V)) is applied to the gate electrode of the charging transistor 2311 at a time t0. When the charging transistor 2311 is turned on, a voltage begins to be applied to the gate electrode of the output transistor 2312, and the output transistor 2312 is turned on as well. Here, the drive pulse VI, which is input to the drain region of the output transistor 2312, is a ground potential, and a potential difference, which is the same as the power supply voltage VDD, occurs between the both ends of the bootstrap capacitor 2313. As a result, the bootstrap capacitor 2313 is to be charged until it gains the same voltages as the power supply voltage VDD (3(V)).

Next, when the drive pulse V1 rises up to 3(V) and is input to the drain region of the output transistor 2312 at a time t1, a high voltage HB1 (6(V)), which is the addition of the voltage 3(V) of the drive pulse V1 and the voltage 3(V) at the both ends of the bootstrap capacitor 2313, is applied to the gate electrode of the output transistor 2312, as a pulse VN11. Accordingly, the output node 2314 outputs an operation pulse VN12 having an amplitude of 3(V) as an output pulse Out1 to the switching device units corresponding to the pixels 11 and 12 in the 1$^{st}$ column for the pixel selection circuit 24.

Also, the pulse Vn11 at the high voltage HB1 is applied to the gate electrode of the charging transistor 2321 included in the 2$^{nd}$ stage 232. As a result, the charging transistor 2321 is turned on. Then, when the charging transistor 2321 in the 2$^{nd}$ stage 232 is turned on, the output transistor 2322 is turned out as well. The drive pulse V2 is a ground potential. Therefore, the bootstrap capacitor 2323 is charged until it gains the same voltages as the power supply voltage VDD (3(V)).

When the drive pulse V2 rises up to 3(V) and is input to the drain region of the output transistor 2322 at a time t2, a high voltage HB2 (6(V)), which is the addition of the voltage 3(V) of the drive pulse V2 and the voltage 3(V) at the both ends of the bootstrap capacitor 2323, is applied to the gate electrode of the output transistor 2322, as a pulse VN21. Accordingly, the output node 2324 outputs an operation pulse VN22 having an amplitude of 3(V) as an output pulse Out2 to the switching device units corresponding to the pixels 13 and 14 in the 2$^{nd}$ column for the pixel selection circuit 24.

Also, the pulse VN21 at the high voltage HB2 is applied to the gate electrode of the charging transistor 2331 included in the 3$^{rd}$ stage 233 for performing the same drive operation as described above. At a time t3, the output node 2334 outputs an operation pulse VN32 as an output pulse Out3 having an amplitude of 3(V) to the switching device units corresponding to the pixels 15 and 16 in the 3$^{rd}$ column for the pixel selection circuit 24.

Also, the operation pulse VN22 from the output node 2324 in the 2$^{nd}$ stage 232 turns on the discharge transistors 2316 and 2317 at the same time. Then, the charged content in the bootstrap capacitor 2313 is to be discharged.

Note that the discharge of the bootstrap capacitor 2313 may be performed with the drive pulse V2.

As described above, the horizontal shift register 23 whose transistors are all n-channel MOS type has fewer transistors than the horizontal shift register 50 shown in FIG. 11 formed by the conventional CMOS process, but can generate and sequentially output the output pulses Out1 to 3 which are free from a voltage drop.

Therefore, the horizontal shift register 23 provides an equal performance to the horizontal shift register 50, including the drive speed.

Note that other than the horizontal shift register 23, the drive circuit region 20 includes the timing generator circuit 21, the vertical shift register 22, and the pixel selection circuit 24, and so on, and they can provide an equal performance to the counterparts that are designed and manufactured based on the CMOS process technology.

The Device Structure of the Transistor in the MOS Type Imaging Apparatus 1

In the MOS type imaging apparatus 1 pertaining to the embodiment of the present invention is characterized in that all the transistors included in both the imaging region 10 and the drive circuit region 20 are n-channel MOS type transistors. The following describes the device structure of the transistors with reference to FIG. 5.

Figure 5:
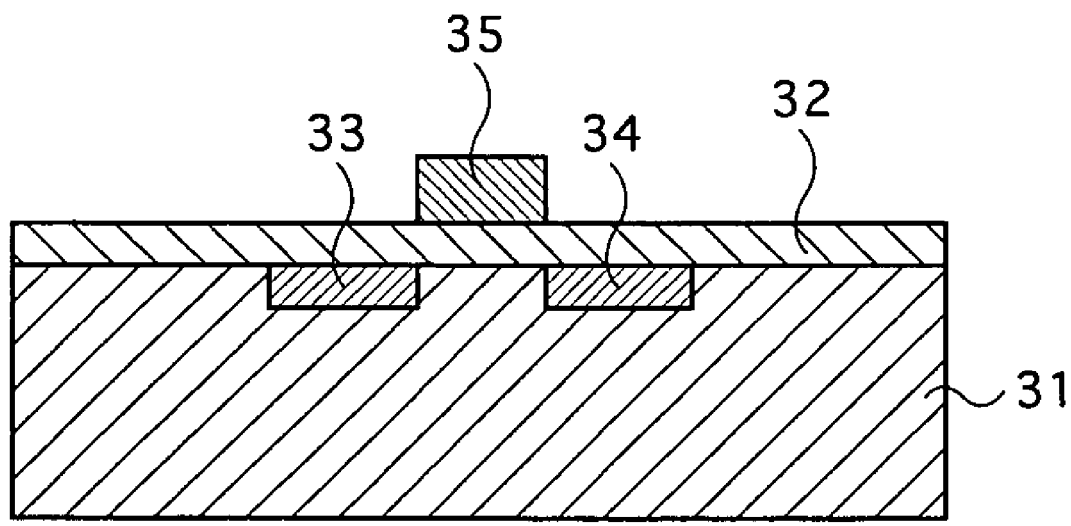
FIG. 5 is a cross-sectional view showing a device structure of a transistor in a horizontal shift register 23.

As FIG. 5 shows, a gate insulator 32 made of SiO$_2$, which is insulative, is formed on the surface of an Si substrate 31. The film thickness of the gate insulator 32 is in a range of 1 (nm) to 20 (nm), for instance.

The Si substrate has the p-type characteristic.

A source region 33 and a drain region 34 are inwardly formed on the boundary portion between the Si substrate 31 and the gate insulator 32 with an interval.

A gate electrode 35 made of polysilicon is formed on the area on the surface of the gate insulator 32, corresponding to the interval between the source region 33 and the drain region 34.

As FIG. 5 shows, an n-channel MOS type transistor is formed on the Si substrate 31 from three electrodes, namely the gate electrode 35, the source region 33 and the drain region 34, and the surface part of the Si substrate just under the gate electrode 35 becoming a channel.

A Method for Forming the Transistor

The following describes a method for forming the transistor included in the MOS type imaging apparatus 1, with reference to FIGS. 6A through 6D and FIGS. 7A and 7B.

Figure 6A:
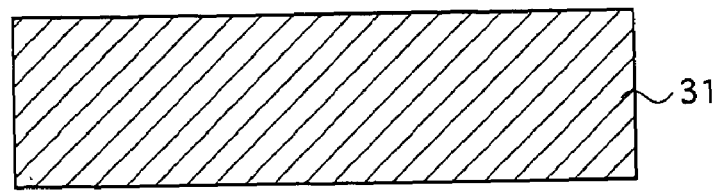
FIGS. 6A through 6D are a manufacturing process chart of an n-channel MOS type transistor.
Figure 6B:
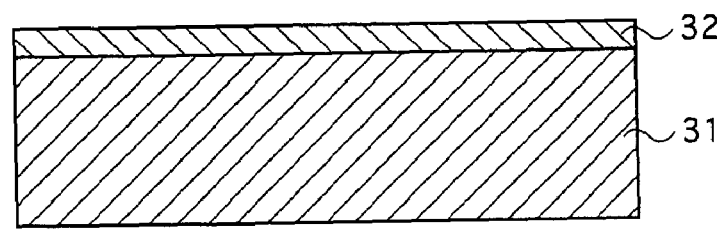

By processing the Si substrate shown in FIG. 6A in oxidizing atmosphere, the Si substrate shown in FIG. 6B made of SiO$_2$ is obtained, on which the gate insulator 32 as an insulator is formed.

Figure 6C:
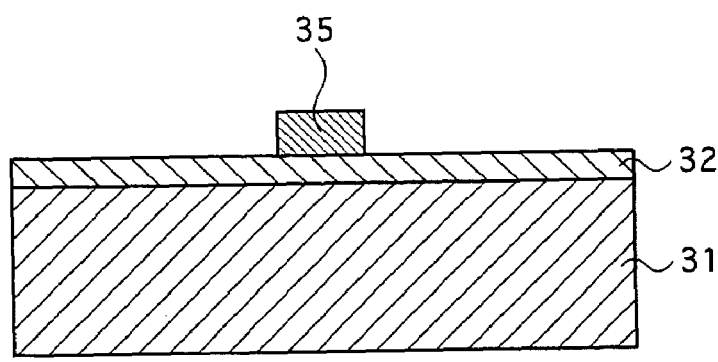

By depositing polysilicon (polycrystalline silicon) in a predetermined area on the surface of the gate insulator 32, a gate electrode 35 is formed as shown in FIG. 6C. For forming the gate electrode 35, the LPCVD method may be used, for instance.

Figure 6D:
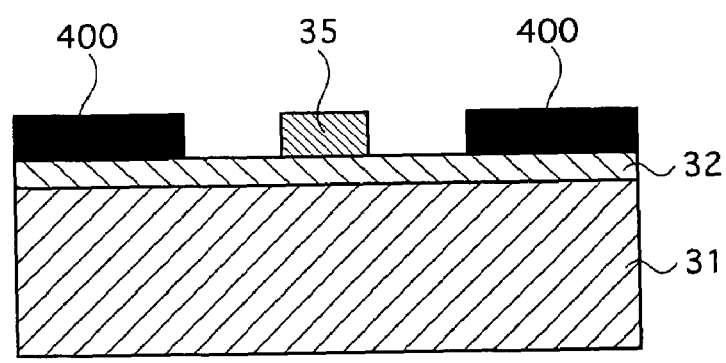

As FIG. 6D shows, resist films 400 are formed with a desired pattern on both sides of the gate electrode 35 on the gate insulator 32 with predetermined intervals.

Figure 7A:
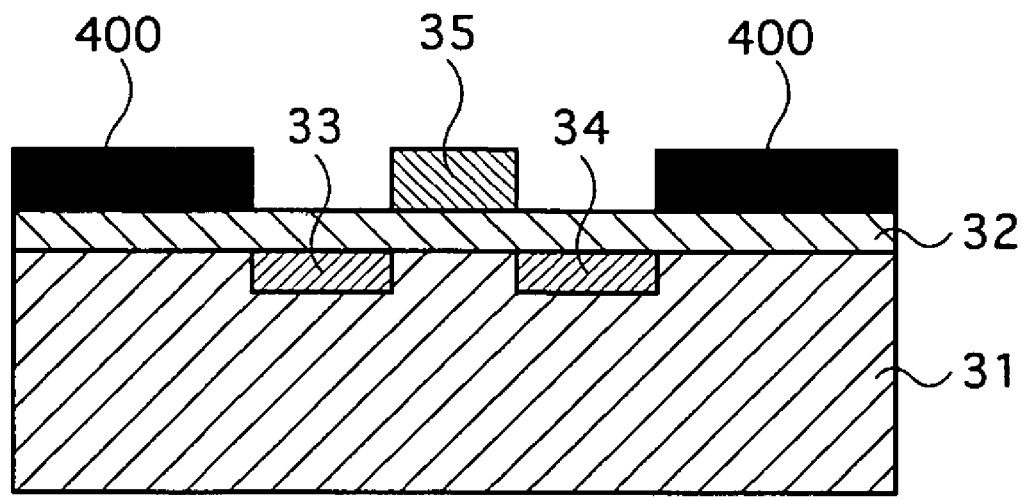
FIGS. 7A through 7B are a manufacturing process chart of an n-channel MOS type transistor.

As FIG. 7A shows, the source region 33 and the drain region 34 are formed by ion implantation of arsenic (As) and phosphorous (P) into the Si substrate 31 from the side of surface of the gate insulator 32 and by heat treatment for activation. When performing the ion implantation, a self-aligning method is used, in which the gate electrode 35 also performs a role as resist, and therefore the position of the source region 33 and the drain region 34 can be determined accurately.

Figure 7B:
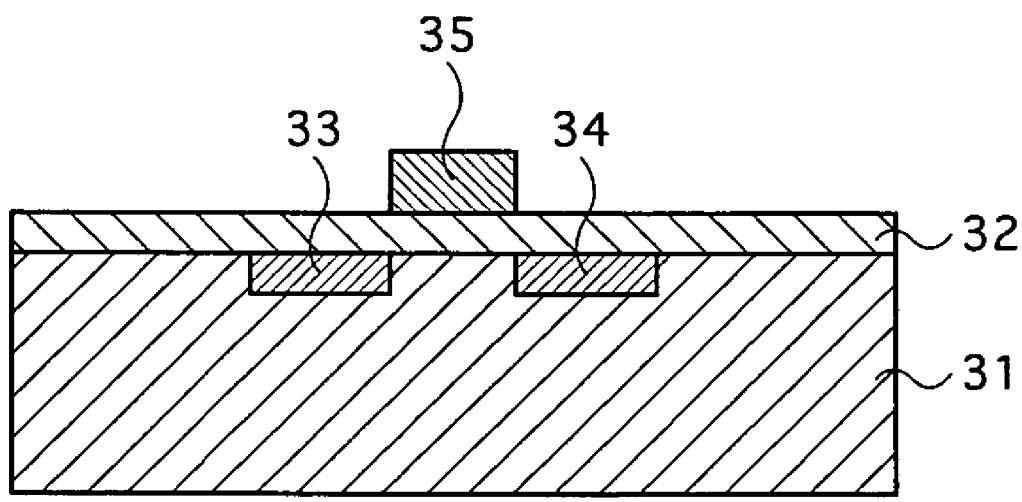

Finally, by ashing process performed in oxygen plasma, the resists 400 are removed, and the transistor is formed on the Si substrate 31 as FIG. 7B shows.

Note that the gate insulator 32 between the gate electrode 35 and the Si substrate 31 in the transistor has a function of a capacitor as well.

Advantages of All the Transistors Being n-Channel MOS Type

As a result of research to find the cause of deterioration of image quality during the driving operation, the inventors discover that a manufacturing method using the above-described CMOS processing technology causes damage during the process to region where the amplification unit or the photodiode unit is formed or to be formed, and the damage affects the image quality during the driving operation.

More specifically, in the above-described manufacturing method, the two steps for removing the resists, namely steps 3 and 6, damages the surface of the Si substrate 61 on which the transistor in the imaging region is to be formed. This damage sometimes causes defects at the bottom parts of the gate electrodes 67 and 70 included in the transistor. These defects might result in characteristic deterioration, such as an increase of 1/f noise.

Also, after the gate electrodes 67 and 70 are formed in the imaging region, the two steps for removing resists, namely steps 11 and 14, sometimes damage the gate insulator 64 on the both sides of the gate electrodes 67 and 70 in the imaging region. When this happens, a leakage current readily occurs between the gate electrodes 67 and 70, the source regions 65 and 68, and the drain regions 66 and 69, which lead to an increase of a noise in the amplification unit. Especially, the leakage current in the amplification unit increases when the gate insulator 32 is a thin film of which the thickness is not more than 20 (nm).

Further, the four steps for removing resists, namely steps 3, 6, 11 and 14 damages the surface of the Si substrate 61 on which the photodiode unit is to be formed, and this damage becomes the cause of the leakage current during the driving operation. This leakage current is to be added to the signal generated by the photoelectric conversion, resulting in the deterioration of the image quality caused by an increase of pixel defects.

As described above, in the MOS type imaging apparatus manufactured with use of the conventional manufacturing method, the imaging region suffers damage during the manufacturing process. This damage causes the leakage current in the photodiode unit and increases the noise in the amplification unit, resulting in the deterioration of the image quality.

In contrast, in the manufacturing method for the MOS type imaging apparatus 1 shown in FIG. 6 and FIG. 7 described above, the resists are removed only once in the manufacturing process for the transistor. Compared to the above-described conventional manufacturing method, the manufacturing method for the MOS type imaging apparatus does not include the steps 3 and 6 for removing resists relating to the formation of the well, because the p-type Si substrate 31 is used. The manufacturing method for the MOS type imaging apparatus includes only the step 11 for removing resists relating to the formation of the source region 33 and the drain region 34.

Therefore, the manufacturing method pertaining to the embodiment suppresses the 1/f noise in the amplification unit caused by a defect at a bottom part of the gate electrode 35, a leakage current in the amplification unit caused by damage of the gate insulator 32 on both sides of the gate electrode 35, and a leakage current in the photodiode unit caused by a defect of the Si substrate 31 at a bottom part of the photodiode unit. In particular, the leakage current can be greatly suppressed when the gate insulator 32 is a thin film of which the thickness is not more than 20 (nm) as well. This shows that the MOS type imaging apparatus 1, in which all the transistors are formed with n-channel MOS type transistors, has advantages.

In conclusion, the MOS type imaging apparatus 1 with high image quality can be manufactured by the manufacturing method pertaining to the embodiment, in which all the transistors in both the imaging region 10 and the drive circuit region 20 are formed with n-channel MOS type transistors. This is because the manufacturing method can suppress the damage on the imaging region 10 caused during the manufacturing process.

Comparative Experiment

The following is a performance comparison between the MOS type imaging apparatus 1, in which all the transistors in both the imaging region 10 and the drive circuit region 20 are formed with n-channel MOS type transistors, and the conventional CMOS type imaging apparatus manufactured with CMOS processing technology.

As to the number of the leakage electrons occurred in the photodiode unit, the leakage electrons occurred in the photodiode unit in a state without input light are read into the gate electrode of the amplification transistor (by the transfer transistor) to be detected. FIG. 8 shows the result of the detection.

Assuming that the number of the leakage electrons occurred in the photodiode unit of the conventional CMOS type imaging apparatus is 1, the number of the leakage electrons occurred in the photodiode unit of n-channel MOS type imaging apparatus is 0.82, as FIG. 8 shows. That is, the number of the leakage electrons is reduced by 18%.

As to he S/N ratio in the amplification unit (the amplification transistor), the S/N ratio is measured in a camera manufactured so as to include the solid-state imaging apparatus, with use of an S/N measuring instrument. FIG. 9 shows the measurement result.

As FIG. 9 shows, the S/N ration in the amplification unit is 57 dB in the n-channel MOS type imaging apparatus, whereas the S/N ratio is 54 dB in the conventional CMOS type imaging apparatus, which means that the n-channel MOS type imaging apparatus has 3 dB advantage.

As described above, the MOS type imaging apparatus 1, in which all the transistors on the Si substrate 31 are formed with n-channel MOS type transistors, has advantages of two characteristics over the conventional CMOS type imaging apparatus, namely the number of the leakage electrons occurred in the photodiode and the S/N ratio in the amplification unit. This is because the photodiode unit and the amplification transistor suffer less damage in the manufacturing process.

In conclusion, as the above-described result of the comparison shows, the MOS type imaging apparatus 1 pertaining to the embodiment has a characteristic that realizes high-quality images, because all the transistors in both the imaging region 10 and the drive circuit region 20 are formed with n-channel MOS type transistors, in which less leakage current occurs in the photodiode unit during the driving operation, and less noise occurs in the amplification transistor.

Supplementary Explanations

Note that the above-described embodiment is an example for explaining the characteristics and the advantages of the present invention. Therefore, the present invention is not limited to the example except that all the transistors in the apparatus are formed with n-channel MOS type transistors, which is the essential characteristic.

For instance, as to the number of the pixels in the imaging region and the arrangement of the pixels, the structure of the pixels is not limited to the above-described structure having 2 rows×3 columns. Also, other circuits may be included in the drive circuit region in addition to the above-described circuits 21 to 24.

Also, the circuit diagrams shown in FIG. 2 and FIG. 3 are examples as well. Other circuit structures in accordance with the intended use of the apparatus may be employed.

Further, a device isolation unit made of a dispersive oxidized film and soon maybe formed between adjacent transistors. Note, however, that the photodiode, the amplification transistor and so on should be protected against damage in the process for manufacturing the device isolation unit to prevent the noise which occurs during the driving operation.

In the above-described embodiment, an Si substrate having the p-type characteristics is used. However, the Si substrate having p-type wells, which are formed on where those are required, may be used. An SOI (Silicon on Insulator) may be used as well. This is effective in improving the isolation between the functional portions and between the circuits.

INDUSTRIAL APPLICABILITY

The solid-state imaging apparatus pertaining to the present invention and the manufacturing method for the same are effective in realizing a solid-state imaging apparatus with reduced leakage current during the driving operation and high-quality images.

The invention claimed is:

1. A solid-state imaging apparatus that includes an imaging region and a drive circuit region both formed on one semiconductor substrate, the imaging region including an active-type unit pixel in which a photodiode unit generates signal charge by photoelectric conversion and an amplification unit amplifies the signal charge, the drive circuit region being for driving the photodiode unit and the amplification unit, the imaging region and the drive circuit region including one or more transistors respectively, wherein
the drive circuit region includes at least a vertical shift register and a horizontal shift register, and
all the transistors in the imaging region and the drive circuit region have a same channel polarity.

2. The solid-state imaging apparatus according to claim 1, wherein the transistors are of an n-channel MOS type.

3. The solid-state imaging apparatus according to claim 1, wherein the drive circuit region includes a dynamic circuit that includes a capacitor for accumulating electric charge and a transistor for performing a switching function.

4. The solid-state imaging apparatus according to claim 3, wherein the imaging region includes a plurality of active-type unit pixels, and
the drive circuit region includes a pixel selection circuit for selecting one active-type unit pixel from the plurality of active-type unit pixels and a shift register circuit for outputting a selection instruction signal to the pixel selection circuit.

5. The solid-state imaging apparatus according to claim 1, wherein
the imaging region includes a transistor for performing a switching function based on a signal received from the drive circuit region, and
the signal charge is output to the amplification unit while the transistor for performing the switching function is ON.

6. The solid-state imaging apparatus according to claim 1, wherein
the transistor is of a MOS type, of which a gate length is equal to or less than 0.6 µm.

7. The solid-state imaging apparatus according to claim 1, wherein
the transistor is of a MOS type, of which a film thickness of a gate insulator is in a range from 1 nm to 20 nm.

8. The solid-state imaging apparatus according to claim 1, wherein
the transistor is of a MOS type, and
an insulator that has a film thickness in a range from 1 nm to 20 nm and functions as a capacitor is formed between a gate electrode of the transistor and the semiconductor substrate.

9. A camera that includes the solid-state imaging apparatus according to claim 1.

10. A manufacturing method for a solid-state imaging apparatus, comprising steps of:
forming, on a semiconductor substrate, an imaging region including a photodiode unit for converting input light into signal charge and an amplification unit for amplifying the signal charge; and
forming, on the semiconductor substrate, a drive circuit region that is for driving the imaging region and includes at least a vertical shift register and a horizontal shift register, wherein
all transistors formed in both steps for forming the imaging region and the drive circuit region respectively are MOS type transistors having a same channel polarity.

11. The manufacturing method for a solid-state imaging apparatus according to claim 10, wherein
the MOS type transistors formed in the both steps are of n-channel MOS type.

12. The manufacturing method for a solid-state imaging apparatus according to claim 10, wherein
a gate length of each MOS type transistor is equal to or less than 0.6 µm.

13. The manufacturing method for a solid-state imaging apparatus according to claim 10, wherein
a film thickness of a gate insulator in each MOS type transistor is in a range from 1 nm to 20 nm.

14. The manufacturing method for a solid-state imaging apparatus according to claim 10, wherein
an insulator that has a film thickness in a range from 1 nm to 20 nm and functions as a capacitor is formed between a gate electrode of each MOS type transistor and the semiconductor substrate.

* * * * *